(12) United States Patent
Karp et al.

(10) Patent No.: US 11,508,667 B1
(45) Date of Patent: Nov. 22, 2022

(54) EMBEDDED SHIELD FOR PROTECTION OF MEMORY CELLS

(71) Applicant: XILINX, INC., San Jose, CA (US)

(72) Inventors: James Karp, Saratoga, CA (US); Yan Wang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 36 days.

(21) Appl. No.: 16/717,708

(22) Filed: Dec. 17, 2019

(51) Int. Cl.
*H01L 23/552* (2006.01)
*H01L 23/528* (2006.01)
*H01L 23/50* (2006.01)

(52) U.S. Cl.
CPC ............ *H01L 23/552* (2013.01); *H01L 23/50* (2013.01); *H01L 23/528* (2013.01); *H01L 2924/1437* (2013.01); *H01L 2924/3025* (2013.01)

(58) Field of Classification Search
CPC ....... B81B 3/0064–0094; B81B 7/0009–0029; B81B 7/0058; B81B 7/0064; B81B 2207/115; H01L 23/60–62; H01L 23/552–556; H01L 23/522–53295; H01L 2924/3025; H01L 2924/1437; H01L 2924/1436–14369; H01L 2924/1441; H01L 21/768–76898; H01L 21/823475; H01L 21/3205–32155; H01L 21/28291; H01L 2221/10–1094; H01L 24/18–25; H01L 2224/18–225; H01L 2224/82–82986; H01L 45/085; H01L 45/12–1253; H01L 45/1266–14; H01L 45/145–1691; H01L 27/11–1116; H01L 27/092–0928; H01L 27/108–10897; H01L 27/1436–14369; H01L 27/1023; H01L 27/11502–11514; H01L 27/11585–11597; H01L 27/0248–0296; H01L 28/40–92; H01L 29/516; H01L 29/6684; H01L 29/78391; H01L 51/426–4266; G11C 11/5614;
(Continued)

(56) References Cited

U.S. PATENT DOCUMENTS 7,522,395 B1 * 4/2009 Tien ........................ H02H 9/046
361/111
7,923,830 B2 * 4/2011 Pope ........................ H01L 25/16
257/679

(Continued)

OTHER PUBLICATIONS

Lohrke, Heiko, et al., "Key Extraction Using Thermal Laser Stimulation—A Case STudy on Xilinx Ultrascale FPGAs", IACR Transactions on Cryptographic Hardware and Embedded Systems ISSN 2569-2925, vol. 2018, No. 3, pp. 573-595.

*Primary Examiner* — Lawrence C Tynes, Jr.
(74) *Attorney, Agent, or Firm* — Patterson + Sheridan, LLP

(57) ABSTRACT

Some examples described herein provide for a shield in an integrated circuit (IC) structure for memory protection. In an example, an IC structure includes a semiconductor material, an interconnect structure, and a shield. The semiconductor material has a protected region. Devices are disposed in a first side of the semiconductor material in the protected region. The interconnect structure is disposed on the first side of the semiconductor material. The interconnect structure interconnects the devices in the protected region. The shield is disposed on a second side of the semiconductor material opposite from the first side of the semiconductor material. The shield is positioned aligned with the protected region.

18 Claims, 11 Drawing Sheets

(58) Field of Classification Search
CPC ........... G11C 11/41–419; G11C 11/401–4099;
G11C 11/22–2297; G11C 11/5657; G11C
13/0011; G11C 14/0009–0045; G11C
14/0027; G11C 14/0072; G11C
2211/4016; Y10S 977/943–947
See application file for complete search history.

(56) References Cited

U.S. PATENT DOCUMENTS

| | | | |
|---|---|---|---|
| 10,044,514 B1 | 8/2018 | Peterson et al. | |
| 2007/0018334 A1* | 1/2007 | Peytavy ........... | G06K 19/07381 |
| | | | 257/778 |
| 2007/0038865 A1* | 2/2007 | Oggioni ................ | G06F 21/87 |
| | | | 713/178 |
| 2010/0078779 A1* | 4/2010 | Barth ...................... | H01L 21/71 |
| | | | 257/659 |
| 2016/0165730 A1* | 6/2016 | Fu ........................ | H01L 25/0657 |
| | | | 361/748 |
| 2016/0214855 A1* | 7/2016 | Yeh ..................... | B81C 1/00246 |
| 2017/0213821 A1* | 7/2017 | Or-Bach ............. | H01L 21/6835 |
| 2019/0172826 A1* | 6/2019 | Or-Bach ............. | H01L 27/0688 |
| 2019/0267336 A1* | 8/2019 | Raorane ................ | H01L 23/522 |

* cited by examiner

US 11,508,667 B1

EMBEDDED SHIELD FOR PROTECTION OF MEMORY CELLS

TECHNICAL FIELD

Examples of the present disclosure generally relate to an embedded shield for memory cell protection.

BACKGROUND

Programmable integrated circuits (ICs) are generally user configurable and capable of implementing digital logic operations. Several types of programmable ICs exist, including Complex Programmable Logic Devices (CPLDs) and Field Programmable Gate Arrays (FPGAs), for example. CPLDs can include function blocks based on a programmable logic array (PLA) architecture and programmable interconnect lines to route and transmit signals between the function blocks. FPGAs may include configurable logic blocks (CLBs), input output blocks (IOBs), other programmable tiles, and programmable interconnect lines that route and transmit signals between the various programmable tiles. In FPGAs, each CLB includes look-up tables and other configurable circuitry that is programmable to implement a logic function. The function blocks of CPLDs, CLBs of FPGAs, and interconnect lines are configured by data stored in a configuration memory of the respective devices. A programmable IC can be configured or program by writing to the configuration memory based on configuration data, such as a bitstream.

SUMMARY

Some examples described herein provide for a shield in an integrated circuit (IC) structure for memory protection. The shield can act as an embedded Faraday cage and can block electromagnetic radiation from impinging on, and reduce or prevent an induced voltage on, devices. Other aspects and benefits can be achieved by various examples.

An example of the present disclosure is an IC structure. The IC structure includes a semiconductor material, an interconnect structure, and a shield. The semiconductor material has a protected region. Devices are disposed in a first side of the semiconductor material in the protected region. The interconnect structure is disposed on the first side of the semiconductor material. The interconnect structure interconnects the devices in the protected region. The shield is disposed on a second side of the semiconductor material opposite from the first side of the semiconductor material. The shield is positioned aligned with the protected region.

Another example of the present disclosure is a method for forming an IC structure. Devices are formed in a first side of a semiconductor material. The devices are formed in a protected region of the semiconductor material. An interconnect structure is formed on the first side of the semiconductor material. The interconnect structure interconnects the devices in the protected region. A shield is formed on a second side of the semiconductor material opposite from the first side of the semiconductor material. The shield is positioned aligned with the protected region.

A further example of the present disclosure is an IC structure. The IC structure includes a semiconductor material, an interconnect structure, a shield, a detector circuit, and an erase circuit. The semiconductor material has a protected region. Devices are disposed in a first side of the semiconductor material in the protected region. The interconnect structure is disposed on the first side of the semiconductor material. The interconnect structure interconnects the devices in the protected region into memory cells. The shield is disposed on a second side of the semiconductor material opposite from the first side of the semiconductor material. The shield is aligned with and extends laterally beyond boundaries of the protected region. The detector circuit is disposed, at least in part, in the semiconductor material. The detector circuit is coupled to and configured to detect a presence of the shield. The detector circuit is further configured to output a signal responsive to the presence of the shield. The erase circuit is disposed, at least in part, in the semiconductor material and is coupled to the detector circuit. The erase circuit is configured to receive the signal output by the detector circuit. The erase circuit is configured to erase data stored by the memory cells when the signal output by the detector circuit indicates that the shield is not present.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
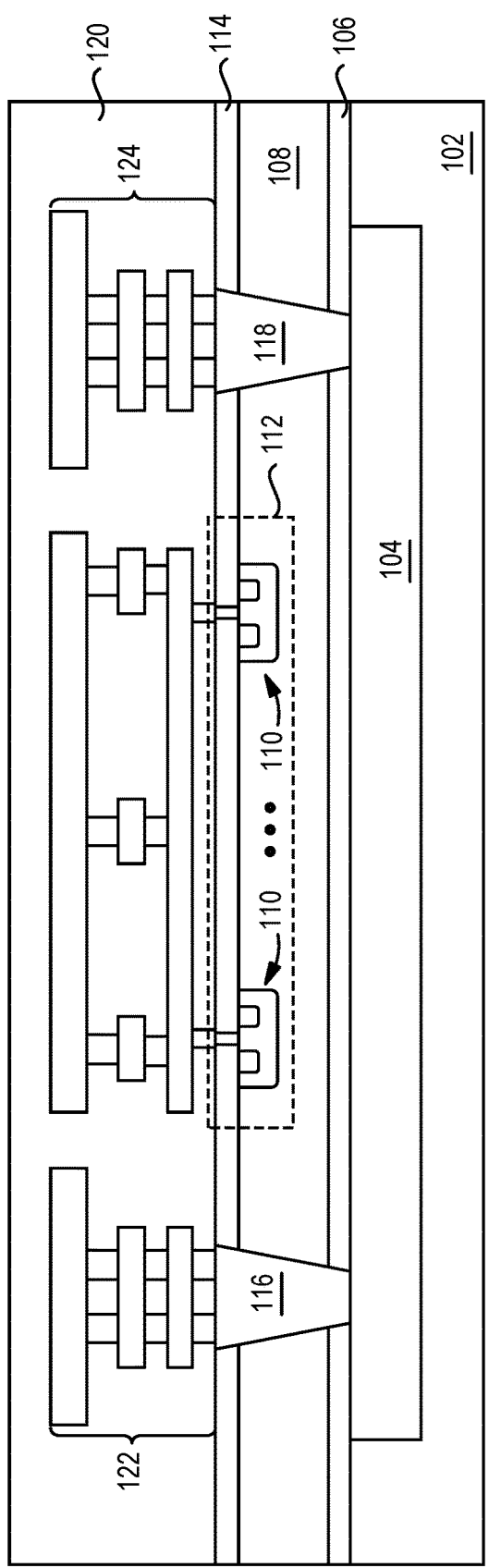
FIG. 1 is a simplified cross-sectional view of an integrated circuit (IC) structure according to some examples.

Some examples described herein provide for a shield in an integrated circuit (IC) structure for memory protection. Generally, devices can be formed in and/or on a semiconductor material, such as a semiconductor substrate or a semiconductor layer disposed on a semiconductor substrate.

Those devices can be interconnected by an interconnect structure to form memory cells. The interconnect structure can be disposed on a first side (e.g., front side) of the semiconductor material. A shield can be disposed on a second side (e.g., backside) of the semiconductor material. The shield can act as an embedded Faraday cage and can block electromagnetic radiation from impinging on, and reduce or prevent an induced voltage on, the devices formed in the semiconductor material when such electromagnetic radiation is directed to the devices from a direction of the second side of the semiconductor material.

Additionally, some examples can provide for a detector circuit and erase circuit. The detector circuit and erase circuit can be formed in the IC structure. The detector circuit is configured to detect when the shield has been removed. In response to the detector circuit detecting that the shield has been removed, the erase circuit is configured to erase data stored in the memory cells. Accordingly, if an attacker attempts to remove the shield for a physical attack (that uses electromagnetic radiation directed to the devices from a direction of the second side of the semiconductor material), data written to the memory can be erased before the attacker can access the data.

Emerging paradigms are increasing a need for security for devices and the intellectual property (IP) that are on those devices. Third party data centers and cloud computing permit a user to use resources owned and operated by a third party. Field programmable gate array (FPGA) devices are increasingly being used in such data centers and for cloud computing. The FPGA devices can be offered to users as FPGA-as-a-Service (FaaS). In such instances, a user can implement its user design on an FPGA device owned and operated by a third party. The user design can include IP owned by the user. The user generally does not control physical access to the FPGA device. Controlling physical access to the FPGA device can be a significant limitation on an ability to secure the IP that is instantiated on the FPGA device from an attacker attempting to illicitly obtain that IP.

In a FaaS environment, a user generally transmits a boot image file to the FPGA device, and the boot image file is stored in non-volatile memory, such as flash memory, which may be on-chip with the FPGA device or may be off-chip from the FPGA device. The boot image file includes configuration data (e.g., a bitstream) that implements the user design. The FPGA device includes a controller that loads and executes the boot image file, which causes the controller to configure the FPGA device according to the user design. As a result of these processes, the user design is stored in the non-volatile memory, which could be physically accessed by an attacker. Additionally, an attacker can monitor a port of the FPGA device through which the user design is read from the non-volatile memory.

To safeguard against access of the user design, the boot image file or partitions of the boot image file can be encrypted before being transmitted to the FPGA device and as stored in the non-volatile memory. As an example, the boot image file or partitions of the boot image file can be encrypted using the Advanced Encryption Standard (AES) or Data Encryption Standard (DES). Encryption techniques typically implement encryption keys to encrypt and decrypt data. Without the encryption keys, encrypted data is meaningless. Hence, IP in configuration data in a boot image file can have some security by being encrypted.

The FPGA device can have a decryption hardblock that decrypts any encrypted boot image file, or partition thereof, during the process of configuring the FPGA device according to the user design. In some FPGA devices (e.g., the UltraSCALE Series FPGAs available from Xilinx, Inc.), the decryption hardblock stores encryption keys in battery-backed static random access memory (BBRAM), which can implement a quasi-non-volatile memory based on the ability to retain data when the device is powered down or turned off while the battery backup supply is present and operational. These FPGA devices can implement some countermeasures against physical access for obtaining the encryption keys; however, such countermeasures may require the FPGA device to be powered up or turned on to be implemented and/or effective.

It has been shown, however, that the BBRAM that stores the encryption keys can be vulnerable to physical attack when the FPGA device is powered down or turned off. Thermal laser stimulation (TLS) has been used to obtain encryption keys stored in BBRAM. Generally, the transistors of the BBRAM cells are thermally stimulated by a laser through a backside of the FPGA device to generate a Seebeck voltage in the BBRAM cells. The response to the laser stimulation and the Seebeck voltage can be obtained and analyzed to extract the encryption keys.

Some examples described herein provide for a shield, which can act as an embedded Faraday cage, on a FPGA device that protects or reduces the generation of a Seebeck voltage in BBRAM cells such that the BBRAM cells are less vulnerable to physical attack by TLS. Additionally, it is foreseeable that an attacker may attempt to remove the shield (e.g., by milling or backside grinding) in an attempt to physically attack the BBRAM cells. Accordingly, some examples described herein provide for a detector circuit that detects when the shield has been removed, and an erase circuit that responsively erases data stored by the BBRAM cells. Although various examples described herein may be described in the context of a FPGA device and/or BBRAM, aspects described herein can be implemented for protection of any programmable IC and/or any memory.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 illustrates a simplified cross-sectional view of an IC structure according to some examples. The IC structure includes a semiconductor substrate 102 and a shield 104 disposed in the semiconductor substrate 102. A dielectric layer 106 is over and on the semiconductor substrate 102 and the shield 104. A semiconductor layer 108 (e.g., a semiconductor material) is over and on the dielectric layer 106. Devices 110 (e.g., transistors) are disposed in and/or on the front side of the semiconductor layer 108 in a protected region 112. The shield 104 is disposed on a back side of the semiconductor layer 108 opposite from the front side of the semiconductor layer 108. An inter-layer dielectric (ILD) 114 is disposed over and on the front side of the semiconductor layer 108 and the devices 110.

Deep vias 116, 118 extend through the ILD 114, the semiconductor layer 108, and the dielectric layer 106 to the shield 104. An interconnect structure 120 comprising a number of metal layers and inter-metallization dielectrics (IMDs) is formed over the ILD 114 and on the front side of the semiconductor layer 108. The interconnect structure 120 includes a stack 122 comprising metal lines and vias of the metal layers, and the stack 122 is connected by vias to the deep via 116. The interconnect structure 120 further includes a stack 124 comprising metal lines and vias of the metal layers, and the stack 124 is connected by vias to the deep via 118. In the illustrated example, deep vias 116, 118 connect to the shield 104. Hence, the stack 122, deep via 116, shield 104, deep via 118, and stack 124 form an electrical path. In some examples, the electrical path can be connected to a detector circuit, as will be described in detail subsequently. In other examples, the shield 104 can be floating in the semiconductor substrate 102, and no vias connect to the shield 104. In some examples, the deep vias 116, 118 and stacks 122, 124 can be omitted.

The interconnect structure 120 further includes metal lines and vias that interconnect the devices 110 in an appropriate circuit. In some examples, the devices 110 can include complementary transistors that are interconnected by the interconnect structure 120 to form static random access memory (SRAM) cells. Each SRAM cell can be capable of storing a bit of data. Further, the SRAM cells may be configured to be connected to a battery backup supply when the IC is powered down or off. The SRAM cells can be BBRAM cells.

In some examples, the shield 104 can prevent a physical attack on the BBRAM cells when the IC is powered down or off. For example, the shield 104 can act as an embedded Faraday cage and can block electromagnetic radiation (e.g., a laser in a TLS technique) from impinging on, and reduce or prevent a Seebeck voltage on, the devices 110 when such electromagnetic radiation is directed to the devices from a direction of the second side of the semiconductor material. This can protect the BBRAM cells from physical attack using the TLS technique.

Figure 2:
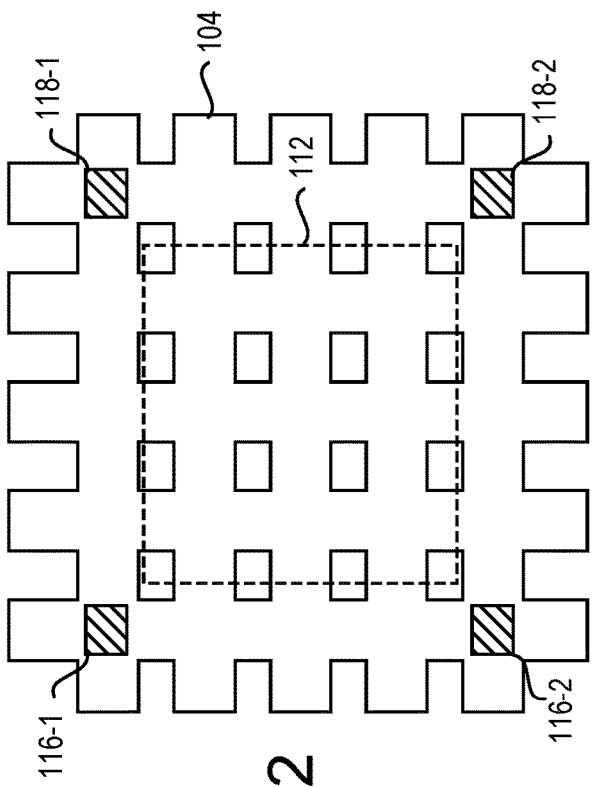
FIG. 2 is a layout view of a shield and corresponding protected region according to some examples.

FIG. 2 illustrates a layout view of a shield 104 and corresponding protected region 112 according to some examples. FIG. 2 illustrates the lateral positioning of the protected region 112 relative to the shield 104. The shield 104 aligns vertically with the protected region 112 and extends laterally beyond the lateral boundaries of the protected region 112. In this configuration, the shield 104 covers and protects the devices 110 in the protected region 112 from electromagnetic radiation directed at the devices 110 in the protected region 112 from the backside of the IC structure.

Deep vias 116-1, 116-2, 118-1, 118-2 are connected to the shield 104 outside of the protected region 112. The stack 122 can extend laterally between the deep vias 116-1, 116-2. The stack 124 can extend laterally between the deep vias 118-1, 118-2. In some examples, the stack 122 and deep vias 116-1, 116-2 can be connected to a ground node, and the stack 124 and deep vias 118-1, 118-2 can be connected to a ground node. In some examples, the stack 122 and deep vias 116-1, 116-2 can be connected to a ground node, and the stack 124 and deep vias 118-1, 118-2 can be connected to a detector circuit, as will be described in detail subsequently.

In the illustrated example, the shield 104 is a mesh. Each dimension of each opening of the mesh is less than a wavelength of a laser, such as on the order of less than 100 nm. In other examples, the shield 104 can be a continuous layer.

Figure 3:
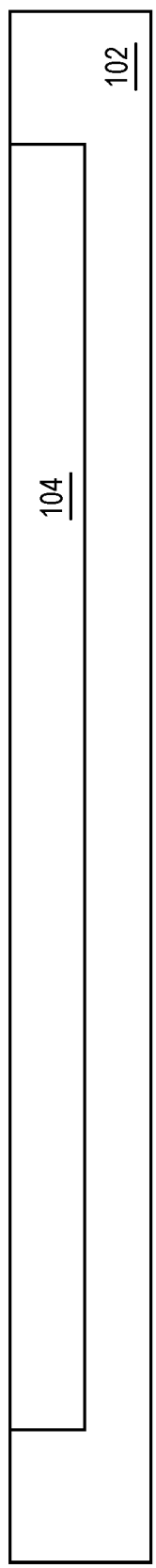
FIGS. 3 through 7 are cross-sectional views of respective structures during processing to form a first IC structure according to some examples.

FIGS. 3 through 7 illustrate cross-sectional views of respective structures during processing to form a first IC structure (e.g., the structure of the integrated circuit of FIG. 1) according to some examples. FIG. 3 shows the shield 104 formed in the semiconductor substrate 102. The semiconductor substrate 102 can be any appropriate semiconductor substrate, such as a bulk semiconductor substrate, a semiconductor-on-insulator (SOI) substrate, or the like. In some examples, the semiconductor substrate 102 is a bulk silicon wafer. A pattern for the shield 104 is etched into the semiconductor substrate 102. The pattern can be for a mesh like shown in FIG. 2, a continuous sheet, or any other pattern. The etching can be by any appropriate photolithography process and etch process, such as a dry anisotropic etch like reactive ion etching (RIE). A metal, such as a refractory metal, is deposited in the pattern etched in the semiconductor substrate 102. Example refractory metal includes molybdenum (Mo), cobalt (Co), titanium (Ti), tantalum (Ta), etc. The metal can be deposited by any appropriate deposition process, such as physical vapor deposition (PVD), chemical vapor deposition (CVD), evaporation, or the like. In other examples, a polysilicon is deposited in the pattern etched in the semiconductor substrate 102, such as by CVD, PVD, or the like. Any appropriate material that is substantially opaque or non-transparent to electromagnetic radiation, such as laser light, can be used. The metal, polysilicon, or other material can be planarized, such as by a chemical mechanical polish (CMP), to have a top surface coplanar with a top surface of the semiconductor substrate 102 and to remove excess metal, which results in the shield 104 being formed in the semiconductor substrate 102. In some examples, the metal, polysilicon, or other material can be deposited as a continuous sheet and planarized, and then can be patterned by photolithography and etch processes into, e.g., a mesh to form the shield 104.

Figure 4:
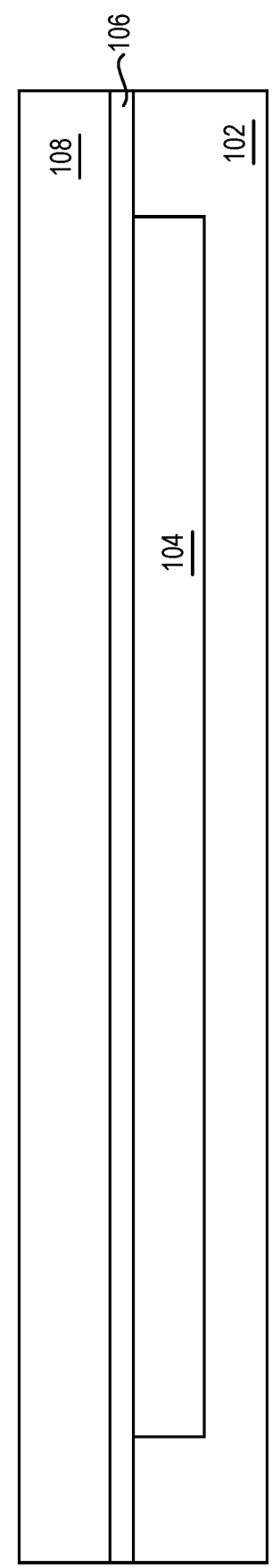

FIG. 4 shows the dielectric layer 106 and semiconductor layer 108 formed on the semiconductor substrate 102 and shield 104. The dielectric layer 106 is deposited on the semiconductor substrate 102 and the shield 104. The dielectric layer 106 can be, for example, silicon oxide, silicon nitride, silicon oxynitride, or any other dielectric material, and can be deposited using CVD, atomic layer deposition (ALD), or another deposition process. The semiconductor layer 108 is formed on the dielectric layer 106. In some examples, the semiconductor layer 108 is formed by epitaxially growing the semiconductor layer, such as by using an epitaxial lateral overgrowth (ELO) technique. In some examples, the semiconductor layer 108 is formed by bonding another substrate having the semiconductor layer 108 to the dielectric layer 106 and removing the other substrate, such as by a separation by implantation of oxygen (SIMOX) technique. The semiconductor layer 108 can be any appropriate semiconductor, such as silicon, silicon germanium, silicon carbide, etc. The semiconductor layer 108 can be planarized, e.g., by CMP, to form a planar top surface.

Figure 5:
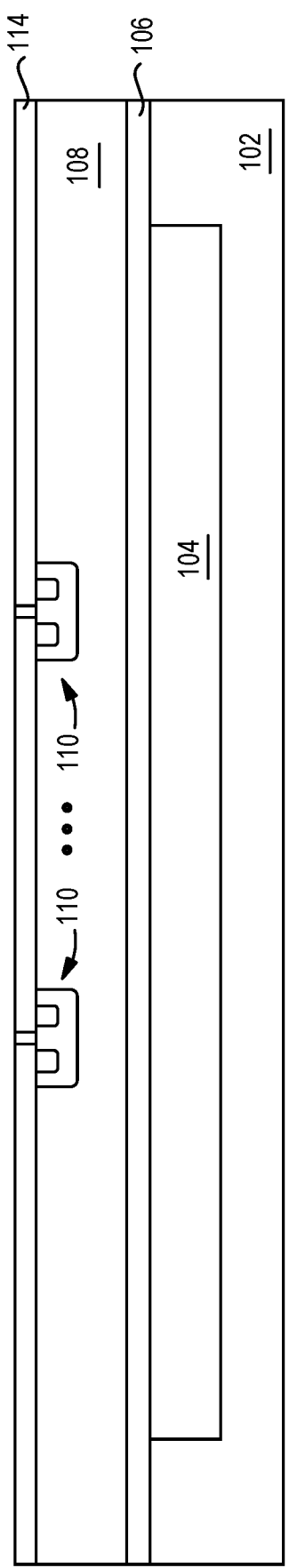

FIG. 5 shows the devices 110 formed in and/or on the front side of the semiconductor layer 108 and the ILD 114 formed on the front side of the semiconductor layer 108. The devices 110 can be or include transistors, including complementary transistors, which can further be planar and/or fin transistors. The devices 110 and the ILD 114 can be formed according to appropriate front-end-of-line (FEOL) processing. Such processing will be readily understood by a person having ordinary skill in the art, and description of such is omitted here for brevity. As stated previously, BBRAM cells are formed in the protected region 112 (not identified in FIG. 5). Each BBRAM cell includes at least two n-type transistors and two p-type transistors that are to be connected as cross-coupled inverters. Each BBRAM cell can include other transistors, such as pass-gate transistors.

Figure 6:
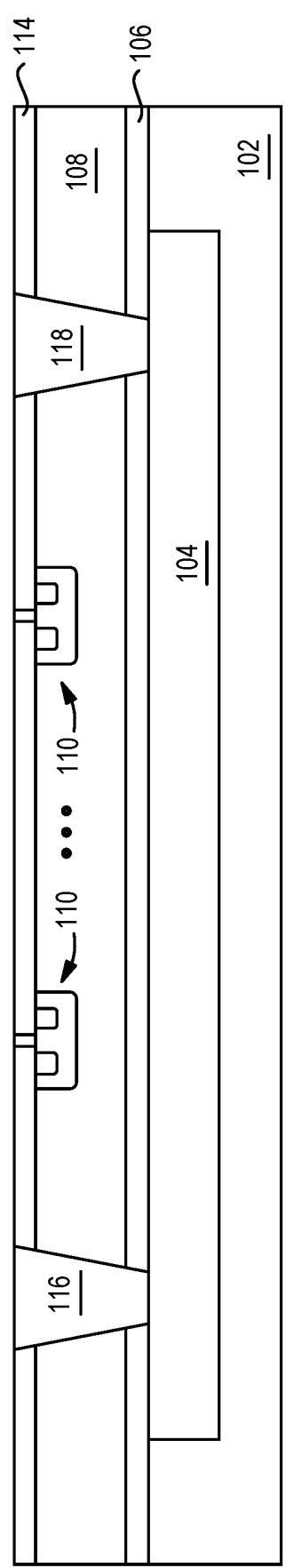

FIG. 6 shows the deep vias 116, 118 formed through the ILD 114, semiconductor layer 108, and dielectric layer 106 to the shield 104. Via openings are formed through the ILD 114, semiconductor layer 108, and dielectric layer 106 to the shield 104. The via openings can be formed using an appropriate etch process, such as deep RIE. Metal, such as tungsten (W), cobalt (Co), copper (Cu), aluminum (Al), or the like, is deposited in the via openings, such as by CVD, PVD, or the like, to form the deep vias 116, 118 connected to the shield 104. Any excess metal can be removed by planarization, e.g., a CMP. In some examples, a barrier and/or adhesion layer can be formed in the via openings before the metal is deposited. The barrier and/or adhesion layer can be or include titanium (Ti), tantalum (Ta), titanium nitride (TiN), tantalum nitride (TiN), or the like, and can be deposited by CVD, ALD, or the like. The processing of FIG. 6 can be omitted when the deep vias 116, 118 are omitted in the IC structure.

Figure 7:
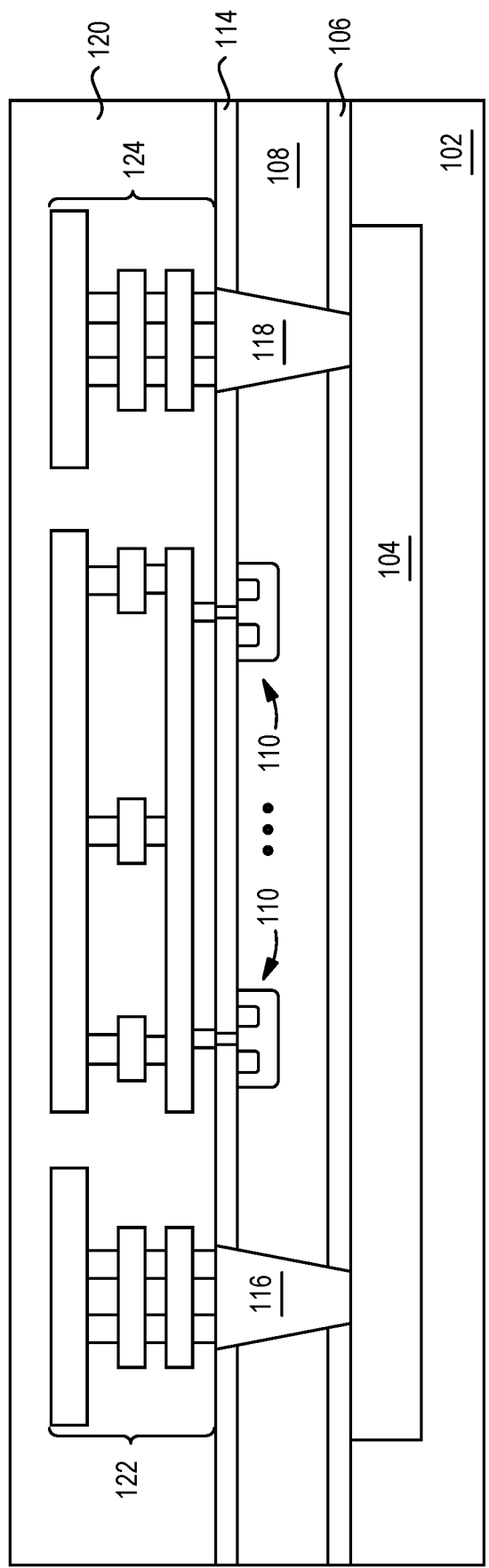

FIG. 7 shows the interconnect structure 120 formed on the ILD 114. The interconnect structure 120 can be formed according to appropriate back-end-of-line (BEOL) processing. Such processing will be readily understood by a person having ordinary skill in the art, and description of such is omitted here for brevity. The interconnect structure 120 includes metal lines and vias that connect the devices 110 into memory cells, e.g., SRAM cells, and further BBRAM cells. Additionally, the stack 122 is formed by stacked metal lines and vias and is connected to deep via(s) 116, and the stack 124 is formed by stacked metal lines and vias and is connected to deep via(s) 118. Subsequent processing may be performed, such as to form external connectors for coupling the IC structure to external components, and such as singulating chips of the semiconductor substrate 102.

Figure 8:
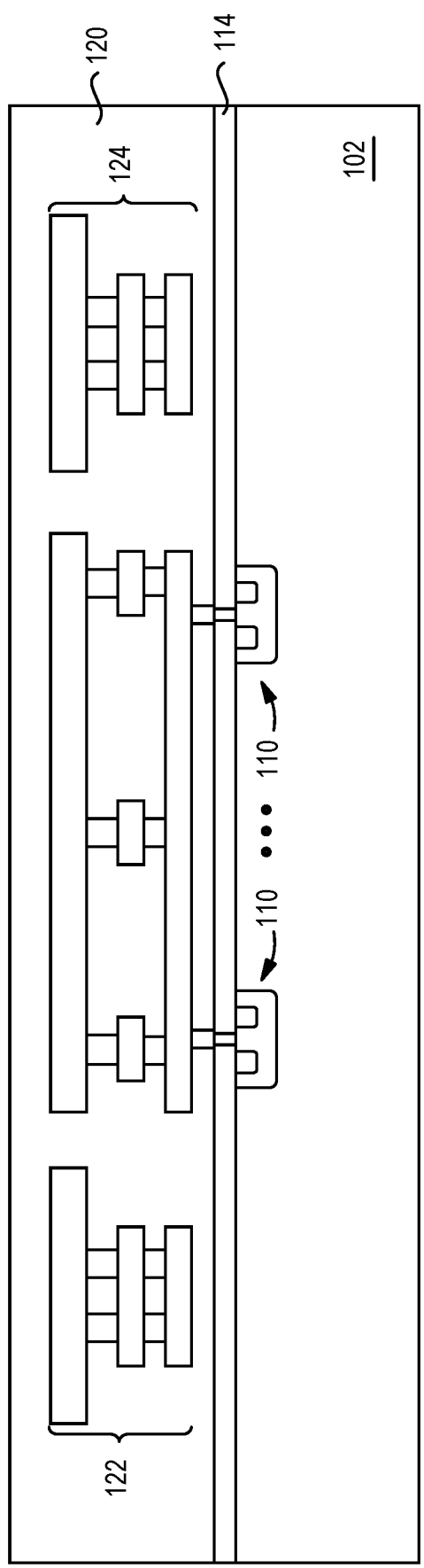
FIGS. 8 through 10 are cross-sectional views of respective structures during processing to form a second IC structure according to some examples.
Figure 9:
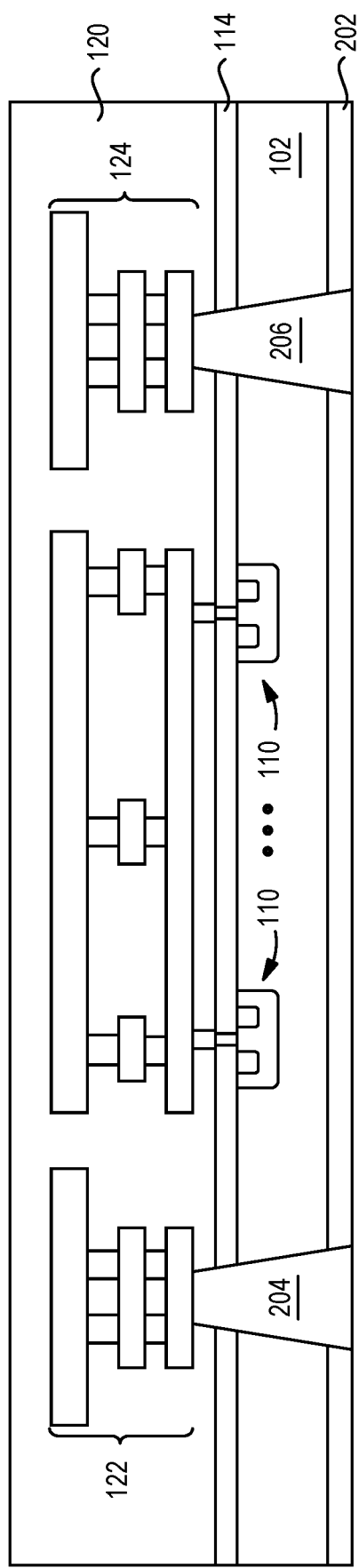
Figure 10:
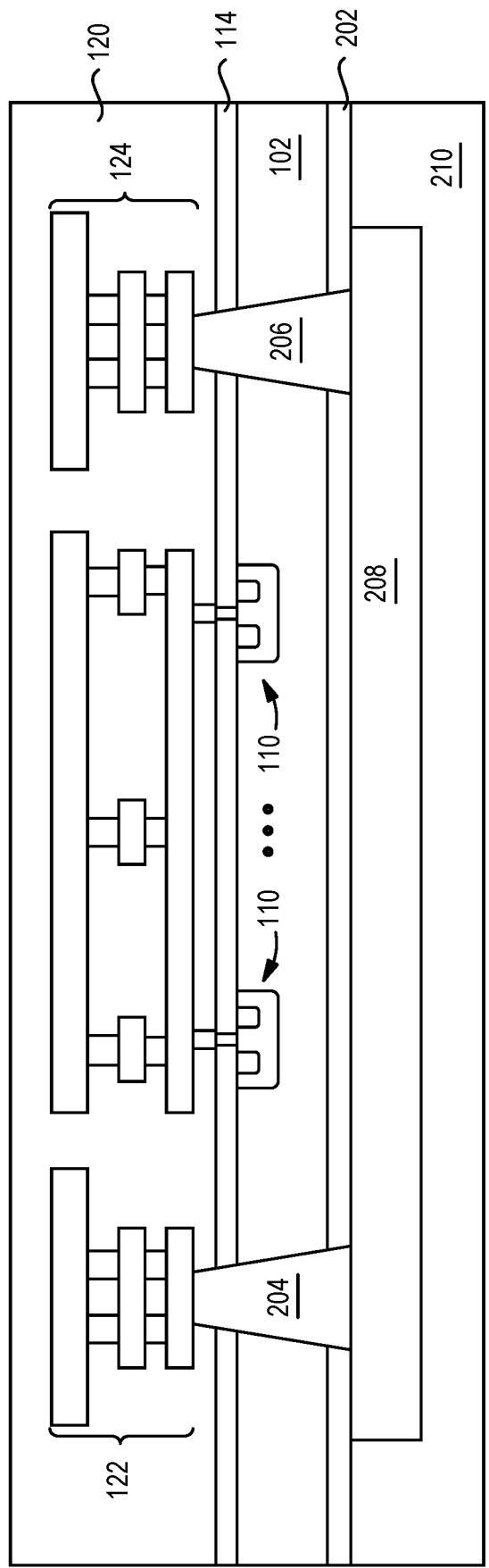

FIGS. 8 through 10 illustrate cross-sectional views of respective structures during processing to form a second IC structure according to some examples. FIG. 8 illustrates a structure formed after FEOL and BEOL processing similar to described above with respect to FIGS. 5 and 7. Devices 110 are formed in and/or on the front side of the semiconductor substrate 102, and the ILD 114 is formed on the front side of the semiconductor substrate 102. The interconnect structure 120 is formed on the ILD 114. The interconnect structure 120 includes metal lines and vias that connect the devices 110 into memory cells, e.g., SRAM cells, and further BBRAM cells.

FIG. 9 illustrates the thinning of the semiconductor substrate 102, formation of a dielectric layer 202, and formation of backside through substrate vias (TSVs) 204, 206. The semiconductor substrate 102 is thinned from a backside, such as by CMP. The dielectric layer 202 can be formed by oxidizing the backside of the semiconductor substrate 102 (e.g., by thermal or chemical oxidation), by depositing a dielectric material on the backside of the semiconductor substrate 102, or other appropriate process. The backside TSVs 204, 206 can be formed by etching via openings through the dielectric layer 202, semiconductor substrate 102, the ILD 114, and, possibly, at least partly into the interconnect structure 120. The via openings can be formed using an appropriate etch process, such as deep RIE. Metal, such as tungsten (W), cobalt (Co), copper (Cu), aluminum (Al), or the like, is deposited in the via openings, such as by CVD, PVD, or the like, to form the backside TSVs 204, 206 connected to the stacks 122, 124, respectively. Any excess metal can be removed by planarization, e.g., a CMP. In some examples, a barrier and/or adhesion layer can be formed in the via openings before the metal is deposited. The barrier and/or adhesion layer can be or include titanium (Ti), tantalum (Ta), titanium nitride (TiN), tantalum nitride (TiN), or the like, and can be deposited by CVD, ALD, or the like. Processing for the backside TSVs 204, 206, such as the etching via opening and depositing the metal, can be omitted when the backside TSVs 204, 206 are omitted (e.g., when the shield is to be floating).

FIG. 10 illustrates a shield 208 formed on the dielectric layer 202 and connected to the backside TSVs 204, 206. The shield 208 can be metal and can be deposited using electroplating or electroless plating, for example. In such examples, a seed layer can be deposited on the dielectric layer 202 (e.g., by PVD); a photoresist can be deposited (e.g., spun on) on the seed layer and patterned; the metal is plated on the exposed seed layer; the photoresist is removed (e.g., by ashing); and exposed portions of the seed layer are removed (e.g., by etching). Other deposition techniques can be implemented. A metal, such as a refractory metal; polysilicon; or other material is deposited as the shield 208. Example refractory metal includes molybdenum (Mo), cobalt (Co), titanium (Ti), tantalum (Ta), etc. In some examples, the metal, polysilicon, or other material can be deposited as a continuous sheet, and in other examples, can be deposited as a mesh. A dielectric layer 210 is then deposited on the shield 208 and dielectric layer 202. The dielectric layer 210 can be, for example, polyphenylene oxide (PPO), polybenzoxazole (PBO), or the like deposited by a spin on technique. Other dielectric materials and deposition processes can be implemented.

In the IC structure of FIG. 10, the stacks 122, 124 are connected to backside TSVs 204, 206, respectively, which are connected to the shield 208. Hence, the stack 122, backside TSVs 204, shield 208, backside TSVs 206, and stack 124 form an electrical path. In some examples, the electrical path can be connected to a detector circuit, as will be described in detail subsequently. In other examples, the shield 208 can be floating on the backside of the semiconductor substrate 102, and no TSVs connect to the shield 208. In some examples, the backside TSVs 204, 206 and stacks 122, 124 can be omitted.

Figure 11:
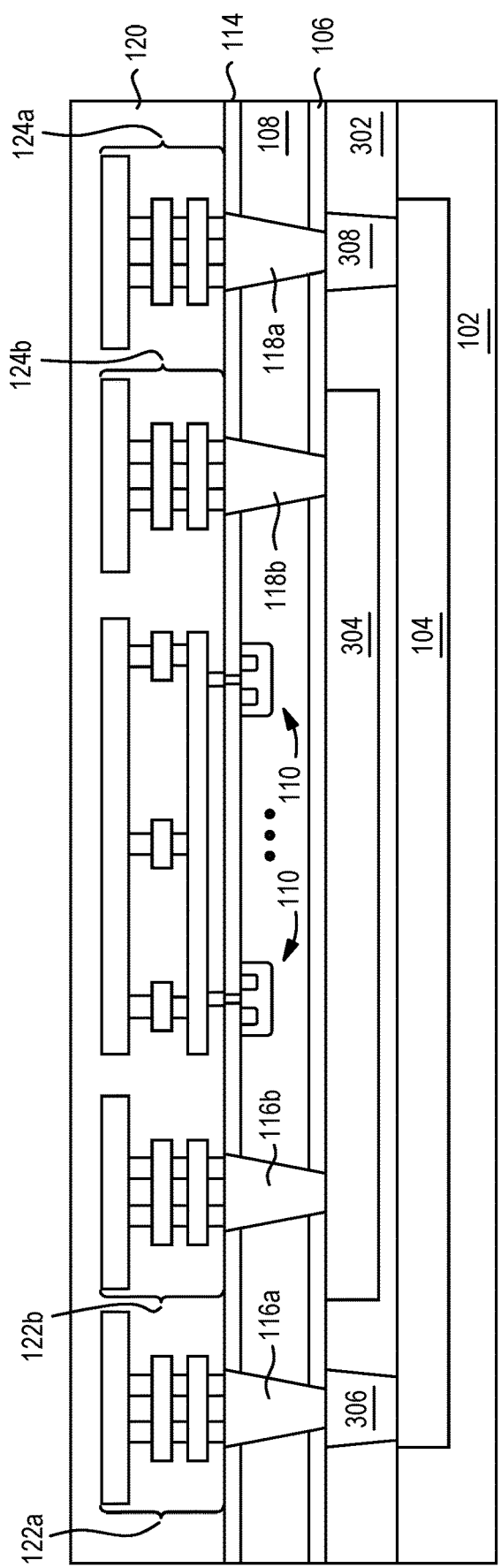
FIG. 11 is a cross-sectional view of a third IC structure according to some examples.

FIG. 11 illustrates a cross-sectional view of a third IC structure, which is a modification to the IC structure of FIG. 7 by including an additional shield, according to some examples. A dielectric layer 302 with a shield 304 therein is disposed between the semiconductor substrate 102 (with the shield 104 therein) and the dielectric layer 106. After the processing illustrated in and described with respect to FIG. 3, the dielectric layer 302 is deposited. The dielectric layer 302 can be, for example, silicon oxide, silicon nitride, silicon oxynitride, or any other dielectric material, and can be deposited using CVD, ALD, or another deposition process. A pattern for the shield 304 is etched into the dielectric layer 302. The pattern can be for a mesh, a continuous sheet, or any other pattern. The etching can be by any appropriate photolithography process and etch process, such as a dry anisotropic etch like RIE. A metal, such as a refractory metal, is deposited in the pattern etched in the dielectric layer 302. Example refractory metal includes molybdenum (Mo), cobalt (Co), titanium (Ti), tantalum (Ta), etc. The metal can be deposited by any appropriate deposition process, such as PVD, CVD, or the like. In other examples, a polysilicon is deposited in the pattern etched in the semiconductor substrate 102, such as by CVD, PVD, or the like. The metal, polysilicon, or other material can be planarized, such as by a CMP, to have a top surface coplanar with a top surface of the dielectric layer 302 and to remove excess metal, which results in the shield 304 being formed in the dielectric layer 302. In some examples, the metal, polysilicon, or other material can be deposited as a continuous sheet and planarized, and then can be patterned by photolithography and etch processes into, e.g., a mesh to form the shield 304. Contemporaneously with the formation of the shield 304, vias 306, 308 can be formed through the dielectric layer 302 to connect to the shield 104.

Processing can then continue as described with respect to FIGS. 4 through 7. Additionally, deep vias 116a, 116b, 118a, 118b are formed to the shields 104, 304 like described with respect to FIG. 6, and the interconnect structure 120 is formed with stacks 122a, 122b, 124a, 124b like described with respect to FIG. 7. The stack 122a is connected to deep via 116a, which is connected to the via 306, and the stack 124a is connected to deep via 118a, which is connected to the via 308. Hence, the stack 122a, deep via 116a, via 306, shield 104, via 308, deep via 118a, and stack 124a form a first electrical path. The stack 122b is connected to deep via 116b, which is connected to the shield 304, and the stack 124b is connected to deep via 118b, which is connected to the shield 304. Hence, the stack 122b, deep via 116b, shield 304, deep via 118b, and stack 124b form a second electrical path.

In some examples, the shields 104, 304 can be connected together by vias, and the vias 306, 308 and one set of deep vias 116, 118 and stacks 122, 124 can be omitted. In such examples, the shields 104, 304 can be parallel path portions of a same electrical path. In further examples, the shields 104, 304 are not connected to other components, e.g., not connected to deep vias 116, 118.

Figure 12:
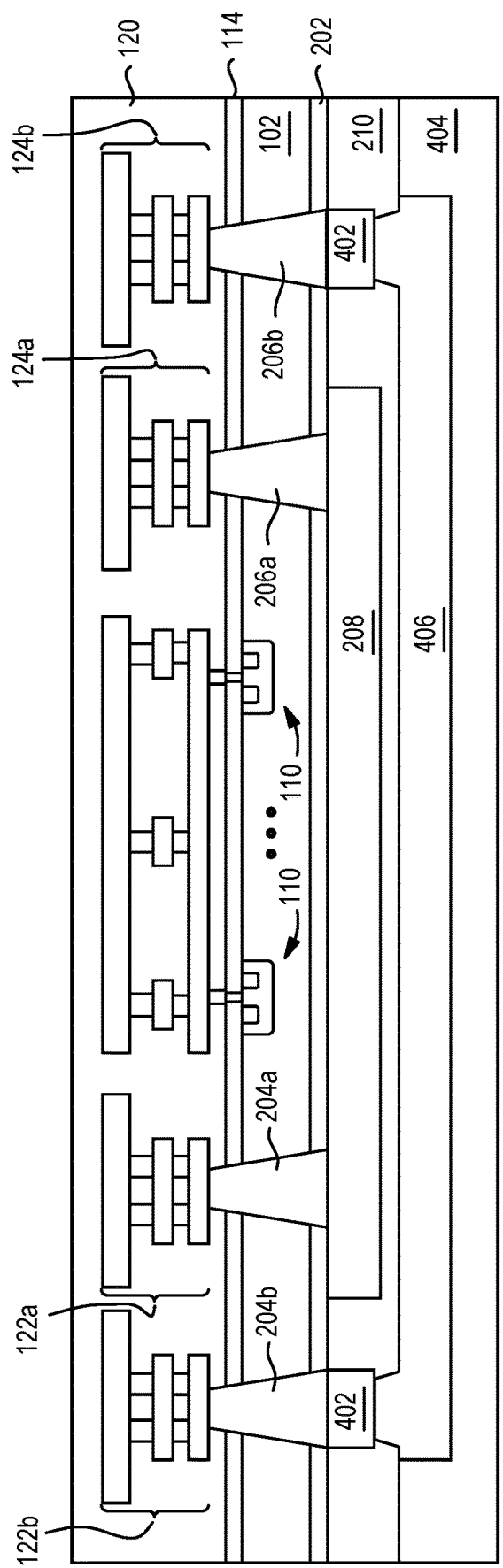
FIG. 12 is a cross-sectional view of a fourth IC structure according to some examples.

FIG. 12 illustrates a cross-sectional view of a fourth IC structure, which is a modification to the structure of FIG. 10 by including an additional shield, according to some examples. Processing proceeds as described with respect to FIGS. 8 through 10. Additionally, the interconnect structure 120 is formed with stacks 122a, 122b, 124a, 124b, and backside TSVs 204a, 204b, 206a, 206b are formed to the stacks 122a, 122b, 124a, 124b like described with respect to FIG. 9. Contemporaneously with the formation of the shield 208, metal lands 402 are formed on the dielectric layer 202. The metal lands 402 are connected to the backside TSVs 204b, 206b. The dielectric layer 210 is further patterned with via openings exposing the metal lands 402, such as by photolithography and/or etching. A shield 406 with vias to the metal lands 402 can be deposited using electroplating or electroless plating, for example. A metal, such as a refractory metal; polysilicon; or other material is deposited as the shield 406. Example refractory metal includes molybdenum (Mo), cobalt (Co), titanium (Ti), tantalum (Ta), etc. In some examples, the metal, polysilicon, or other material can be deposited as a continuous sheet, and in other examples, can be deposited as a mesh. A dielectric layer 404 is then deposited on the shield 406 and dielectric layer 210. The dielectric layer 404 can be, for example, PPO, PBO, or the like deposited by a spin on technique. Other dielectric materials and deposition processes can be implemented.

The stack 122a is connected to the backside TSV 204a, which is connected to the shield 208, and the stack 124a is connected to the backside TSV 206a, which is connected to the shield 208. Hence, the stack 122a, backside TSV 204a, shield 208, backside TSV 206a, and stack 124a form a first electrical path. The stack 122b is connected to backside TSV 204b, which is connected to the metal land 402, and the stack 124b is connected to backside TSV 206b, which is connected to the metal land 402. Hence, the stack 122b, backside TSV 204b, metal land 402, shield 406, metal land 402, backside TSV 206b, and stack 124b form a second electrical path.

In some examples, the shields 208, 406 can be connected together by vias, and the metal lands 402 and one set of backside TSV 204, 206 and stacks 122, 124 can be omitted. In such examples, the shields 208, 406 can be parallel path portions of a same electrical path. In further examples, the shields 208, 406 are not connected to other components, e.g., not connected to backside TSV 204, 206.

Figure 13:
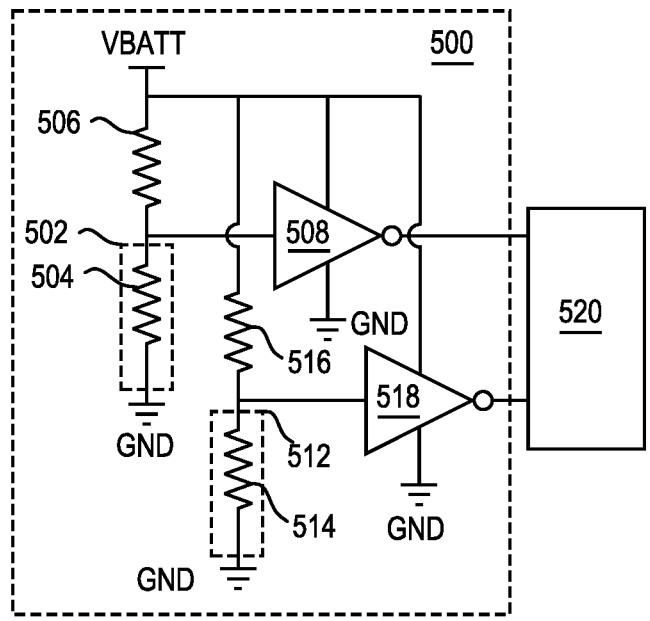
FIG. 13 is a circuit schematic for a detector circuit and erase circuit according to some examples.

FIG. 13 illustrates a circuit schematic for a detector circuit 500 and erase circuit 520 according to some examples. The detector circuit 500 includes impedance paths 502, 512 (including resistance 504, 514), resistors 506, 516, and inverters 508, 518. The detector circuit 500 and erase circuit 520 include a redundant detection scheme in this example. In other examples, a single detection scheme can be implemented.

The resistor 506 has a terminal connected to a battery supply node VBATT and has a second terminal connected to an input node of the inverter 508 and a first terminal of the impedance path 502. A second terminal of the impedance path 502 is connected to a ground node GND. An output node of the inverter 508 is connected to an input node of the erase circuit 520. The inverter 508 is connected between the battery supply node VBATT and ground node GND for a power supply.

The impedance path 502 includes a shield and an electrical path electrically connected to the shield. For example, with reference to FIG. 7, the impedance path 502 can include the stack 122, deep via 116, shield 104, deep via 118, and stack 124. As another example, with reference to FIG. 10, the impedance path 502 can include the stack 122, backside TSV 204, shield 208, backside TSV 206, and stack 124. As another example, with reference to FIG. 11, the impedance path 502 can include the stack 122a, deep via 116a, via 306, shield 104, via 308, deep via 118a, and stack 124a. As an even further example, with reference to FIG. 12, the impedance path 502 can include the stack 122a, backside TSV 204a, shield 208, backside TSV 206a, and stack 124a.

The resistance of the resistor 506 is more than (e.g., much more than) the resistance 504 of the impedance path 502. The resistance of the resistor 506 can be three orders of magnitude or more greater than the resistance 504 of the impedance path 502. For example, the resistance of the resistor 506 can be on the order of 10 MΩ, and the resistance 504 of the impedance path 502 can be on the order of a few ohms. With a high impedance input node of the inverter 508, the resistor 506 and impedance path 502 act as a voltage divider, and, when the resistance of the resistor 506 is much more than the resistance 504 of the impedance path 502, the voltage input at the input node of the inverter 508 is approximately a ground voltage of the ground node GND. This causes the output voltage at the output node of the inverter 508 and at the input node of the erase circuit 520 to be the battery supply voltage VBATT. If the shield that forms a part of the impedance path 502 is removed, the impedance path 502 becomes open (e.g., the electrical path is broken) or infinitely high impedance. With the high impedance input node of the inverter 508, this causes the voltage input at the input node of the inverter 508 to be approximately the battery supply voltage VBATT, which causes the output voltage at the output node of the inverter 508 and at the input node of the erase circuit 520 to be ground voltage GND.

As long as the voltage at the input of the erase circuit 520 from the inverter 508 is logically high or the battery supply voltage VBATT, the erase circuit 520 does not trigger an action that causes data stored in the memory cells (e.g., BBRAM cells) to be erased. If the voltage at the input of the erase circuit 520 from the inverter 508 is logically low or the ground voltage GND, the erase circuit 520 triggers an erase procedure to erase data stored in the memory cells. In some examples, the erase circuit 520 can trigger a circuit to write all "0"s or all "1"s to the memory cells. In some examples, the erase circuit 520 can trigger the battery backup supply to be disconnected from the memory cells such that the memory cells lose data stored in those cells.

The resistor 516 has a terminal connected to the battery supply node VBATT and has a second terminal connected to an input node of the inverter 518 and a first terminal of the impedance path 512. A second terminal of the impedance path 512 is connected to a ground node GND. An output node of the inverter 518 is connected to an input node of the erase circuit 520. The inverter 518 is connected between the battery supply node VBATT and ground node GND for a power supply.

The impedance path 512 includes a shield and an electrical path electrically connected to the shield. For example, with reference to FIG. 11, the impedance path 512 can include the stack 122b, deep via 116b, shield 304, deep via 118b, and stack 124b. As a further example, with reference to FIG. 12, the impedance path 512 can include the stack 122b, backside TSV 204b, metal land 402, shield 406, metal land 402, backside TSV 206b, and stack 124b.

The resistance of the resistor 516 is more than (e.g., much more than) the resistance 514 of the impedance path 512. The resistance of the resistor 516 can be three orders of magnitude or more greater than the resistance 514 of the impedance path 512. For example, the resistance of the resistor 516 can be on the order of 10 MO, and the resistance 514 of the impedance path 512 can be on the order of a few ohms. The operation of the impedance path 512, resistor 516, and inverter 518 is substantially the same as the operation of the impedance path 502, resistor 506, and inverter 508.

The erase circuit 520 can logically AND the signals output by the inverters 508, 518. If any shield of either of the impedance paths 502, 512 is removed, at least one of the signals output by the inverters 508, 518 will be logically low or ground voltage GND, which when ANDed, can cause the erase circuit 520 to detect when a shield is removed to responsively trigger actions to an erase memory cells.

In some examples, the impedance path 512, resistor 516, and inverter 518 can be omitted. The impedance path 512, resistor 516, and inverter 518 can provide redundancy to the detection provided by the impedance path 502, resistor 506, and inverter 508. Different logic and/or circuits can be implemented. FIG. 13 is merely an example to illustrate how removal of a shield may be detected to responsively erase data stored in memory cells.

Figure 14:
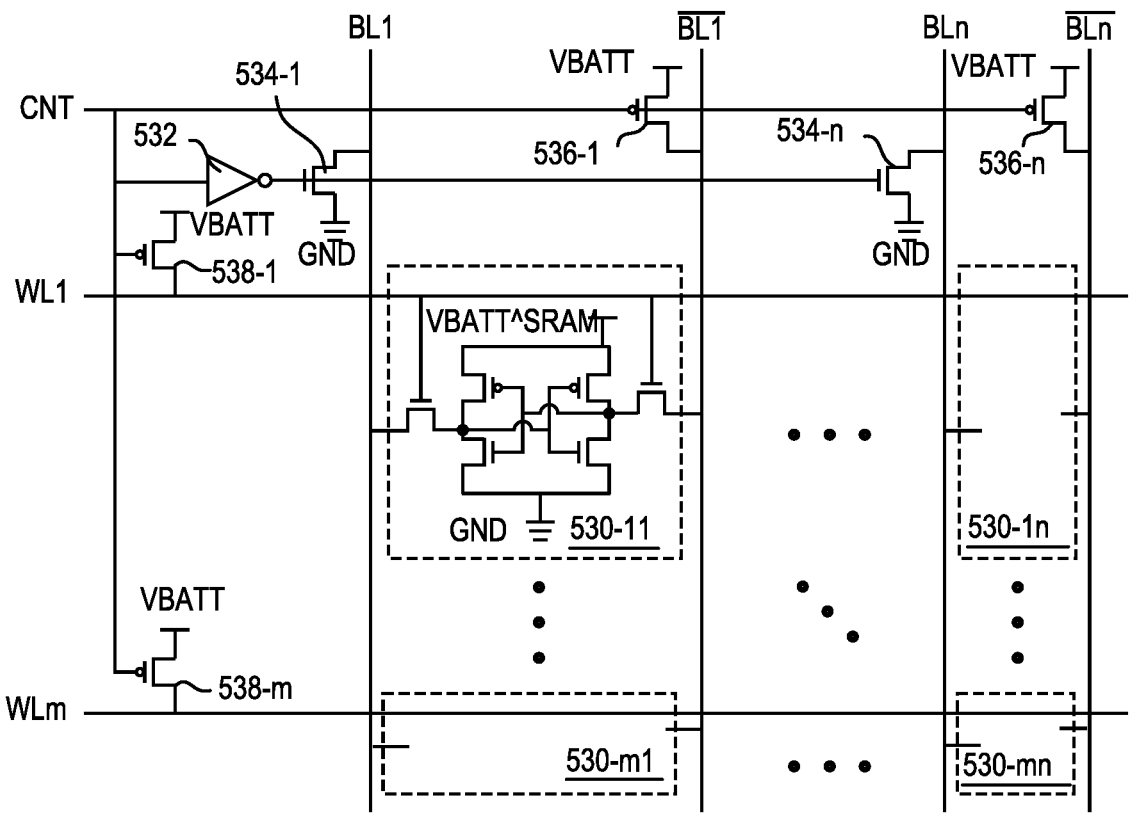
FIG. 14 is a circuit schematic of a static random access memory (SRAM) array and an erase circuit according to some examples.

FIG. 14 depicts a circuit schematic of a SRAM array and an erase circuit according to some examples. The SRAM array includes m rows and n columns of SRAM cells 530-11, 530-m1, 530-1n, 530-mn. SRAM cell 530-11 shows transistors connected in a 6T SRAM configuration, which will be readily understood by a person having ordinary skill in the art. This configuration is replicated for each SRAM cell 530, although not specifically illustrated. Each row of SRAM cells 530 has a respective word line WL1 through WLm. The world line of a row of SRAM cells 530 is connected to gates of pass gate transistors of the SRAM cells 530 within that row. Each column of SRAM cells 530 has a respective bit line BL1 through BLn and a respective complementary bit line $\overline{BL1}$ through $\overline{BLn}$. Source/drains of respective pass gate transistors in each SRAM cell 530 in a column are connected to a bit line and a complementary bit line for that column. Additionally, the pull-down and pull-up transistors within each SRAM cell 530 are connected between an SRAM battery supply node $VBATT_{SRAM}$ and a ground node GND. In this example, the SRAM battery SUPPLY NODE $VBATT_{SRAM}$ CAN BE CONNECTED TO A BATTERY SUPPLY NODE VBATT WITHOUT any intervening circuit.

The erase circuit includes an inverter 532, n-type transistors 534-1 to 534-n, p-type transistors 536-1 to 536-n, and p-type transistors 538-1 to 538-m. An input node of the inverter 532 is connected to a control node CNT. Drains of the n-type transistors 534-1 to 534-n are connected to respective bit lines BL1 to BLn, and sources of the n-type transistors 534-1 to 534-n are connected to a ground node GND. Gates of the n-type transistors 534-1 to 534-n are connected to an output node of the inverter 532. Drains of the p-type transistors 536-1 to 536-n are connected to respective complementary bit lines $\overline{BL1}$ to $\overline{BLn}$, and sources of the p-type transistors 536-1 to 536-n are connected to a battery supply node VBATT. Gates of the p-type transistors 536-1 to 536-n are connected to the control node CNT. Drains of the p-type transistors 538-1 to 538-n are connected to respective word lines WL1 to WLm, and sources of the p-type transistors 538-1 to 538-n are connected to a battery supply node VBATT. Gates of the p-type transistors 538-1 to 538-n are connected to the control node CNT. The control node CNT can be connected to the output node of the inverter 508 of FIG. 13 (e.g., when impedance path 512, resistor 516, and inverter 518 are omitted), or to an output node of an AND gate that ANDs the output signals of the inverters 508, 518.

While a signal on the control node CNT is logically high (like while the detector circuit detects that the shield is present), the transistors 534, 536, 538 are open or in a non-conducting state. Hence, regular operation of the bit lines and word lines can control operation of the SRAM cells 530. When the signal on the control node CNT is logically low (like when the detector circuit detects that the shield is not present), the transistors 534, 536, 538 are closed or in a conducting state. Accordingly, each bit line is brought to a ground voltage on the ground node GND or a logically low signal, and each complementary bit line and each word line is brought to a battery supply voltage VBATT on the battery supply node VBATT or a logically high signal. This causes each SRAM cell 530 to be written with a logically low signal that is capable of being read through the respective bit line. Accordingly, any data stored in the SRAM cells 530 can be erased.

Figure 15:
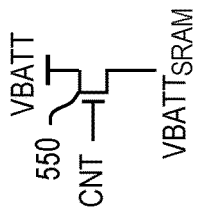
FIG. 15 is a circuit schematic of an erase circuit according to some examples.

FIG. 15 depicts a circuit schematic of an erase circuit according to some examples. A SRAM array can be as shown in and described above with respect to FIG. 14 (except without the erase circuit (e.g., inverter 532 and transistors 534, 536, 538)). In the example of FIG. 15, an n-type transistor 550 is connected between a battery supply node VBATT and a SRAM battery supply node $VBATT_{SRAM}$. A drain of the n-type transistor 550 is connected to the battery supply node VBATT, and a source of the n-type transistor 550 is connected to the SRAM battery supply node $VBATT_{SRAM}$. A gate of the n-type transistor 550 is connected to a control node CNT. The SRAM battery supply node $VBATT_{SRAM}$ is connected to the SRAM cells 530 as shown in FIG. 14.

While a signal on the control node CNT is logically high (like while the detector circuit detects that the shield is present), the n-type transistor 550 is closed or in a conducting state. Hence, the SRAM cells 530 are electrically connected to a power supply from the battery backup supply, and regular operation of the SRAM cells 530 can be implemented. When the signal on the control node CNT is logically low (like when the detector circuit detects that the shield is not present), the n-type transistor 550 is open or in a non-conducting state. Accordingly, the power supply from the battery backup supply is electrically disconnected from the SRAM cells 530, and hence, the data stored in the SRAM cells 530 is erased. The erase circuit of FIG. 15 operates like a power gating circuit.

The various devices that form the detector circuit and erase circuit depicted in and described with respect to FIGS. 13 to 15 can be disposed in and/or on a same semiconductor material (e.g., semiconductor layer 108 or semiconductor substrate 102) in and/or on which the devices 110 are disposed. The devices of the detector circuit and erase circuit can be disposed within the protected region 112 or outside of the protected region 112. The devices of the detector circuit and erase circuit can include transistors of the inverters 508, 518, 532 and transistors 534, 536, 538, 550. In some examples, resistors 506, 516 can be formed in one or more metal layers of the interconnect structure 120 or can be formed in the semiconductor material, within or outside of the protected region 112.

The various transistors and circuits of FIGS. 14 and 15 are shown as examples of erase circuits. Other transistors, switches, or gates can be implemented in the place of the various transistors of FIGS. 14 and 15. Additionally, different circuits can be implemented as an erase circuit.

Figure 16:
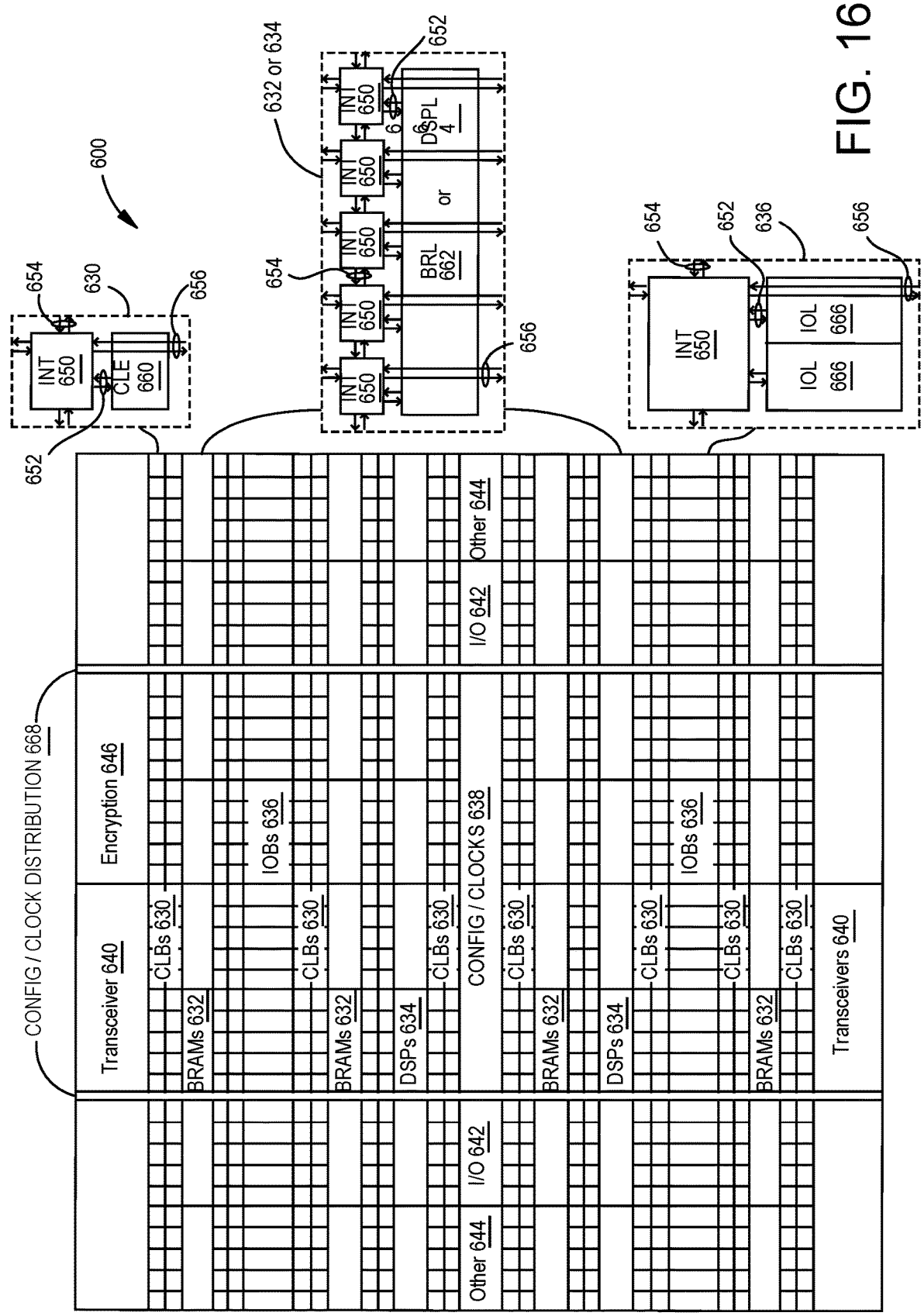
FIG. 16 depicts a field programmable gate array (FPGA) of a programmable IC according to some examples.

FIG. 16 illustrates a FPGA 600 of a programmable IC that may include a shield acting as an embedded Faraday cage as described above, according to some examples. The various devices (e.g., transistors) of the programmable IC can be implemented in and/or on a semiconductor material (e.g., semiconductor layer 108 or semiconductor substrate 102) like the devices 110 described above.

The FPGA 600 includes a large number of different programmable tiles (e.g., that form a programmable fabric) including configurable logic blocks (CLBs) 630, random access memory blocks (BRAMs) 632, signal processing blocks (DSPs) 634, input/output blocks (IOBs) 636, configuration and clocking logic (CONFIG/CLOCKS) 638, digital transceivers 640, specialized input/output blocks (I/O) 642 (e.g., configuration ports and clock ports), and other programmable logic 644 such as digital clock managers, system monitoring logic, PCIe interfaces, analog-to-digital converters (ADC), and so forth. The FPGA 600 includes an encryption hardblock 646.

In some FPGAs, each programmable tile can include at least one programmable interconnect element (INT) 650 having connections to input and output terminals 652 of a programmable logic element within the same tile, as shown by examples included in FIG. 10. Each programmable interconnect element 650 can also include connections to interconnect segments 654 of adjacent programmable interconnect element(s) in the same tile or other tile(s). Each programmable interconnect element 650 can also include connections to interconnect segments 656 of general routing resources between logic blocks (not shown). The general routing resources can include routing channels between logic blocks (not shown) comprising tracks of interconnect segments (e.g., interconnect segments 656) and switch blocks (not shown) for connecting interconnect segments. The interconnect segments of the general routing resources (e.g., interconnect segments 656) can span one or more logic blocks. The programmable interconnect elements 650 taken together with the general routing resources implement a programmable interconnect structure (programmable interconnect) for the illustrated FPGA 600.

In an example implementation, a CLB 630 can include a configurable logic element (CLE) 660 that can be programmed to implement user logic plus a single programmable interconnect element (INT) 650. A BRAM 632 can include a BRAM logic element (BRL) 662 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 634 can include a DSP logic element (DSPL) 664 in addition to an appropriate number of programmable interconnect elements. An IOB 636 can include, for example, two instances of an input/output logic element (IOL) 666 in addition to one instance of the programmable interconnect element 650. As will be clear to those of skill in the art, the actual I/O pads connected, for example, to the input/output logic element 666 typically are not confined to the area of the input/output logic element 666.

In the pictured example, a horizontal area near the center of the die is used for configuration, clock, and other control logic. Vertical columns 668 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic.

Note that FIG. 16 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 16 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The encryption hardblock 646 includes a hardened circuit for decrypting data, such as according to the AES or DES, and includes BBRAM cells in which encryption keys can be stored. A shield can be formed on a backside of the semiconductor material in which the devices of the BBRAM cells are formed. The BBRAM cells are in a protected region, as described above. Additionally, the shield can form part of a detector circuit, which is also included in the encryption hardblock 646. The encryption hardblock 646 can also include an erase circuit that is configured to erase the BBRAM cells when the detector circuit detects that the shield has been removed.

While the foregoing is directed to specific examples, other and further examples may be devised without departing from the basic scope thereof, and the scope thereof is determined by the claims that follow.

What is claimed is:
1. An integrated circuit (IC) structure comprising:
 a first dielectric layer disposed on a semiconductor substrate;
 a semiconductor layer disposed on the first dielectric layer and having a protected region, devices being disposed in a first side of the semiconductor layer in the protected region;

an interconnect structure disposed on the first side of the semiconductor layer, the interconnect structure interconnecting the devices in the protected region; and a first shield disposed on a second side of the semiconductor layer opposite from the first side of the semiconductor layer and on the first dielectric layer, the first shield being positioned aligned with the protected region.

2. The IC structure of claim 1, wherein the first dielectric layer is disposed on a side of the semiconductor substrate corresponding to the second side of the semiconductor layer, and a second dielectric layer is disposed on the first shield.

3. The IC structure of claim 1, wherein the first shield is a metal mesh extending in each lateral direction beyond the protected region.

4. The IC structure of claim 1, wherein the first shield is a metal continuous sheet extending in each lateral direction beyond the protected region.

5. The IC structure of claim 1 further comprising a second shield disposed on the second side of the semiconductor layer, the first dielectric layer being disposed between the first shield and the second shield.

6. The IC structure of claim 1, wherein the devices in the protected region are interconnected via the interconnect structure as static random access memory (SRAM) cells, the SRAM cells being configured to be connected to a battery power supply.

7. The IC structure of claim 1 further comprising:
a detector circuit, at least a portion of which being disposed in the semiconductor layer, the detector circuit being configured to detect a presence of the first shield; and
an erase circuit, at least a portion of which being disposed in the semiconductor layer, the erase circuit being configured to erase data stored on memory cells when the detector circuit detects that the first shield is not present, the devices in the protected region and interconnected via the interconnect structure being the memory cells.

8. The IC structure of claim 1 further comprising:
a detector circuit, at least a portion of which being disposed in the semiconductor layer, the detector circuit being connected to an impedance path that includes the first shield, the detector circuit being configured to responsively output a signal depending on whether the impedance path is closed or open; and
an erase circuit, at least a portion of which being disposed in the semiconductor layer, the erase circuit being configured to responsively erase data stored on memory cells based on the signal output by the detector circuit, the devices in the protected region and interconnected via the interconnect structure being the memory cells.

9. A method for forming an integrated circuit (IC) structure, the method comprising:
forming devices in a first side of a semiconductor layer, the devices being formed in a protected region of the semiconductor layer;
forming an interconnect structure on the first side of the semiconductor layer, the interconnect structure interconnecting the devices in the protected region;
forming a first shield on a second side of the semiconductor layer opposite from the first side of the semiconductor layer, the first shield being positioned aligned with the protected region, wherein the first shield is on a first dielectric layer disposed on a semiconductor substrate;
etching a first pattern in the semiconductor substrate;
forming the first shield in the first pattern;
forming the first dielectric layer over the semiconductor substrate and the first shield; and
forming the semiconductor layer on the first dielectric layer.

10. The method of claim 9, further comprising:
forming a second dielectric layer on the semiconductor substrate and the first shield;
etching a second pattern in the second dielectric layer; and
forming a second shield in the second pattern, wherein the first dielectric layer is formed on the second dielectric layer and the second shield.

11. The method of claim 9, wherein:
forming the first shield includes:
thinning the semiconductor substrate from a side of the semiconductor substrate corresponding to the second side of the semiconductor layer;
forming the first dielectric layer on the side of the semiconductor substrate;
forming the first shield on the first dielectric layer; and
forming a second dielectric layer on the first shield.

12. The method of claim 11 further comprising:
forming a second shield on the second dielectric layer; and
forming a third dielectric layer on the second shield and the second dielectric layer.

13. The method of claim 9, wherein the first shield is a mesh.

14. An integrated circuit (IC) structure comprising:
a semiconductor material having a protected region, devices being disposed in a first side of the semiconductor material in the protected region;
an interconnect structure disposed on the first side of the semiconductor material, the interconnect structure interconnecting the devices in the protected region into memory cells;
a first shield disposed on a second side of the semiconductor material opposite from the first side of the semiconductor material, the first shield aligned with and extending laterally beyond boundaries of the protected region;
a detector circuit disposed, at least in part, in the semiconductor material, the detector circuit being coupled to and configured to detect a presence of the first shield, the detector circuit further being configured to output a first signal responsive to the presence of the first shield; and
an erase circuit disposed, at least in part, in the semiconductor material and coupled to the detector circuit, the erase circuit being configured to receive the first signal output by the detector circuit, the erase circuit being configured to erase data stored by the memory cells when the first signal output by the detector circuit indicates that the first shield is not present.

15. The IC structure of claim 14 further comprising a second shield disposed on the second side of the semiconductor material, the second shield being aligned with and extending laterally beyond boundaries of the protected region, a dielectric layer being disposed between the first shield and the second shield, wherein:
the detector circuit is further coupled to and configured to detect a presence of the second shield, the detector circuit further being configured to output a second signal responsive to the presence of the second shield; and
the erase circuit is configured to receive the second signal output by the detector circuit, the erase circuit being configured to erase data stored by the memory cells when the second signal output by the detector circuit indicates that the second shield is not present.

16. The IC structure of claim 14, wherein the detector circuit includes a resistor and an inverter, the resistor being connected between a battery supply node and an input node of the inverter, an electrical path being connected between the input node of the inverter and a ground node, the electrical path including the first shield, the erase circuit being connected to an output node of the inverter, the first signal being output on the output node of the inverter.

17. The IC structure of claim 14, wherein the erase circuit is configured to assert a signal on each word line of the memory cells and to bring each bit line to a logical value and each complementary bit line to a complementary logical value in response to the first signal output by the detector circuit indicating that the first shield is not present.

18. The IC structure of claim 14, wherein the erase circuit is configured to electrically disconnect the memory cells from a power supply in response to the first signal output by the detector circuit indicating that the first shield is not present.

\* \* \* \* \*